(12) United States Patent
Lee

(10) Patent No.: US 8,581,630 B2
(45) Date of Patent: Nov. 12, 2013

(54) SIGNAL DRIVER CIRCUIT HAVING ADJUSTABLE OUTPUT VOLTAGE FOR A HIGH LOGIC LEVEL OUTPUT SIGNAL

(75) Inventor: Seong-Hoon Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 13/235,243

(22) Filed: Sep. 16, 2011

(65) Prior Publication Data

US 2012/0002489 A1 Jan. 5, 2012

Related U.S. Application Data

(62) Division of application No. 12/101,770, filed on Apr. 11, 2008, now Pat. No. 8,022,729.

(51) Int. Cl.
| | |
|---|---|
| *H03K 19/094* | (2006.01) |
| *H03K 3/00* | (2006.01) |
| *H03B 1/00* | (2006.01) |
| *G11C 7/10* | (2006.01) |
| *G11C 7/00* | (2006.01) |

(52) U.S. Cl.
USPC ........... 326/83; 326/68; 327/108; 365/189.05

(58) Field of Classification Search
USPC ............... 326/80, 83, 86, 87, 68; 365/189.05, 365/189.11; 327/108
See application file for complete search history.

(56) References Cited

U.S. PATENT DOCUMENTS

| | | | |
|---|---|---|---|
| 5,160,855 A | 11/1992 | Dobberpuhl | 327/108 |
| 5,426,383 A | 6/1995 | Kumar | 326/119 |
| 5,453,705 A | 9/1995 | Atallah et al. | 326/86 |
| 5,453,709 A | 9/1995 | Tanimoto et al. | 327/276 |
| 5,760,620 A | 6/1998 | Doluca | 327/112 |
| 6,351,358 B1 * | 2/2002 | Allen | 361/90 |
| 6,407,601 B1 | 6/2002 | Lin | 327/158 |
| 6,496,036 B2 | 12/2002 | Kan | 326/58 |
| 6,570,415 B2 | 5/2003 | Chen et al. | 327/108 |
| 6,614,268 B2 | 9/2003 | Dally et al. | 327/51 |
| 6,803,793 B2 | 10/2004 | Inoue | 326/95 |
| 7,026,854 B2 | 4/2006 | Dake et al. | 327/309 |
| 7,365,571 B2 * | 4/2008 | Seo et al. | 326/83 |
| 7,714,617 B2 * | 5/2010 | Lee | 326/83 |
| 8,022,729 B2 * | 9/2011 | Lee | 326/83 |
| 8,283,946 B2 * | 10/2012 | Lee | 326/81 |
| 2005/0052201 A1 * | 3/2005 | Bernard et al. | 326/82 |
| 2009/0315081 A1 | 12/2009 | Marshall et al. | 257/209 |
| 2010/0060320 A1 * | 3/2010 | Lee | 326/80 |

OTHER PUBLICATIONS

A. Rjoub and O. Koufopavlou, "Low-Swing/Low Power Driver Architecture", Sep. 5-8, 1999 IEEE, pp. 639-642.

* cited by examiner

*Primary Examiner* — Shawki Ismail
*Assistant Examiner* — Dylan White
(74) *Attorney, Agent, or Firm* — Dorsey & Whitney LLP

(57) ABSTRACT

A signal driver circuit having an adjustable output voltage for a high-logic level output signal. The signal driver circuit includes a signal driver configured to output a first logic level signal having a first voltage and output a second logic level signal having a second voltage according to an input signal. A voltage controlled voltage supply coupled to the signal driver provides the first voltage for the first logic level signal. The magnitude of the first voltage provided by the voltage controlled voltage supply is based on a bias voltage. A bias voltage generator can be coupled to the voltage controlled voltage supply to provide the bias voltage.

20 Claims, 7 Drawing Sheets

US 8,581,630 B2

SIGNAL DRIVER CIRCUIT HAVING ADJUSTABLE OUTPUT VOLTAGE FOR A HIGH LOGIC LEVEL OUTPUT SIGNAL

CROSS-REFERENCE TO RELATED APPLICATION

This application is a divisional of U.S. patent application Ser. No. 12/101,770, filed Apr. 11, 2008 and issued as U.S. Pat. No. 8,022,729. This application and patent are incorporated by reference herein in their entirety and for any purposes.

TECHNICAL FIELD

The invention relates generally to signal driver circuitry, and more specifically, to signal driver circuits generating high logic level output signals having a voltage less than a supply voltage.

BACKGROUND OF THE INVENTION

Many of today's electronic systems are portable and provide users with mobility and ease of transport. Laptops, cellular phones, digital cameras, portable gaming systems, handheld GPS receivers, are just a few examples of portable electronic systems. All of these systems have become increasingly lighter and smaller in form factor, while at the same time, however, these systems have ever greater performance than their predecessors. The increased performance typically has come at the expense of greater power consumption. Since these systems rely on battery power, system designers make an effort to design systems for low power consumption so that the systems can be operated for a greater length of time before replacing or recharging the battery.

As part of the effort to design lower power electronic systems, system designers build these systems utilize components and circuitry that operate with lower power consumption. An example is to include a memory system that has low power consumption since today's electronic systems nearly universally include memory systems for storing data that are used during operation. The tradeoff between operating at lower power while maintaining or improving performance is a difficult one since greater memory capacity or improved speed typically come at the cost of additional circuitry, which translates into additional power consumption. As a result, memory system designers are continually looking for creative solutions to improve power consumption, but at the same time, without compromising performance.

BRIEF DESCRIPTION OF THE DRAWINGS

FIG. 1b is a signal diagram of an example output signal of the conventional signal driver of FIG. 1a.

FIG. 2b is a signal diagram of an example output signal of the signal driver circuit of FIG. 2a.

FIG. 5b is a schematic drawing of a voltage supply according to an embodiment of the present invention for the bias voltage circuit of FIG. 5a.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1A:
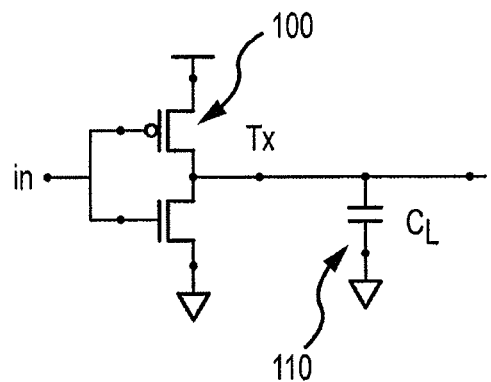
FIG. 1a is schematic drawing of a conventional signal driver coupled to an output load.
Figure 1B:
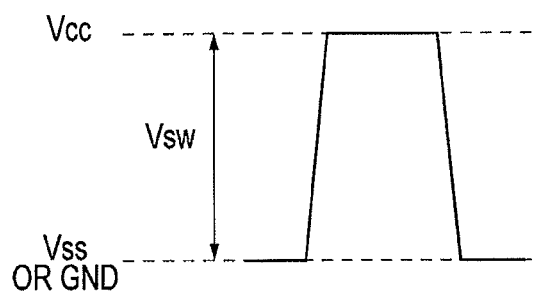

FIG. 1a illustrates a conventional signal driver circuit for driving an output signal Tx having a logic level based on the input signal "in." The signal driver circuit includes a complementary metal-oxide semiconductor ("CMOS") inverter 100 coupled between a supply voltage Vcc and ground. FIG. 1a further illustrates a capacitor 110, which represents the capacitive load driven by the signal driver circuit. In operation, the CMOS inverter 100 drives an output signal having a high-logic level in response to a low-logic level in signal and drives an output signal having a low-logic level in response to a high-logic level in signal. With reference to FIG. 1b, the voltage of the high-logic level is Vcc, that is, the supply voltage, and the voltage of the low-logic level is ground (i.e., 0 V). As known, dynamic power consumption of the CMOS inverter 100 can be calculated using the equation:

$$P = C \times Vcc^2 \times f,$$

where C is the equivalent capacitance for the circuit, Vcc is the supply voltage, and f is the switching frequency of the input signal. As will be discussed in more detail below, embodiments of the present invention provide a signal driver circuit that has lower power consumption compared to the signal driver circuit of FIG. 1a.

Figure 2A:
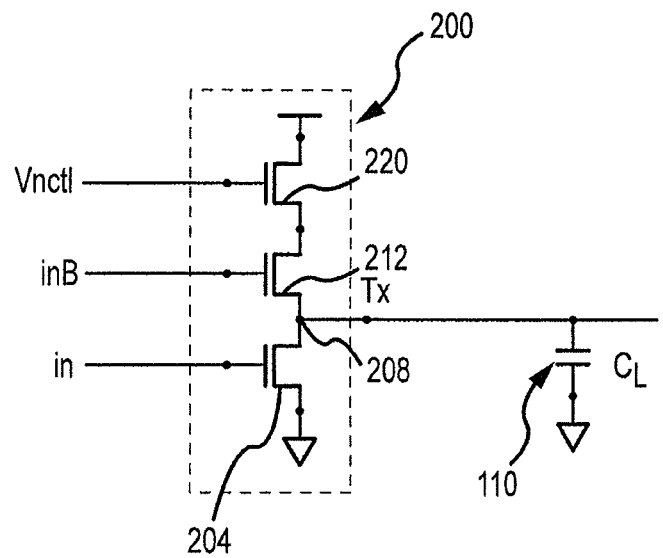
FIG. 2a is a schematic drawing of a signal driver circuit according to an embodiment of the present invention coupled to an output load.

FIG. 2a illustrates an signal driver circuit 200 according to an embodiment of the present invention. The signal driver circuit 200 includes a first transistor 204 having a drain coupled to an output node 208 and a source coupled to a reference node, such as ground. The signal driver circuit 200 further includes and a second transistor 212 having a source coupled to the output node 208. An input signal "in" is applied to a gate of the first transistor and a complementary input signal "inB" is applied to a gate of the second transistor. Conventional circuitry and techniques known to those ordinarily skilled in the art can be used to generate the complementary input signal inB. The transistor 204 pulls the output node 208 down to the reference node (e.g., ground) when activated and the transistor 212 pulls up the output node 208 to a VHigh voltage when activated. The transistors 204 and 212 function as switches to couple and decouple the output node 208 according to the in and inB signals. An output signal Tx is provided at the output node 208 having a logic level in accordance with the logic level of the in (and inB) signal. A third transistor 220 included in the signal driver circuit 200 is coupled to a supply voltage, such as Vcc, and the drain of the second transistor 212. A bias voltage Vnctl is applied to a gate of the transistor 220. The transistor 220 provides a voltage controlled impedance circuit controlled by the Vnctl voltage. In the embodiment of the invention illustrated in FIG. 2a, the transistors 204, 208, 212 are n-channel transistors, for example, n-channel metal-oxide semiconductor ("NMOS") transistors. In other embodiments, the transitors 204, 208, 212 can be other types of transitors as well.

Figure 2B:
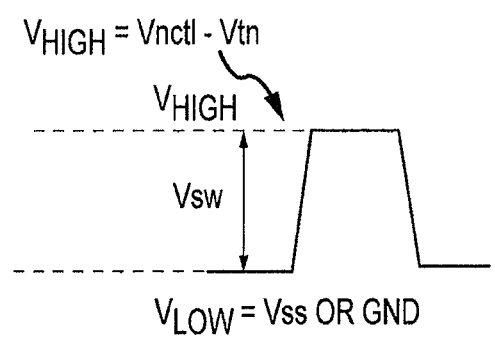

As will be described in more detail below, the Vnctl voltage can be used to control the operation of the transistor 220 to set the voltage VHigh of a high logic level of the Tx signal, and consequently, set the swing voltage Vsw of the signal driver circuit 200. That is, output signals generated by the signal driver circuit 200 will have a Vsw between VLow and VHigh, as shown in FIG. 2b. Where VLow is ground (i.e., 0 V), Vsw is equal to VHigh. Generally, the VHigh voltage is equal to the Vnctl voltage less the threshold voltage Vtn of the third transistor 220. As a result, a VHigh voltage for the signal driver circuit 200 can be set by applying a Vnctl voltage equal to the sum of VHigh and Vtn. The transistor 220, by providing a voltage VHigh based on the Vnctl signal, behaves in some embodiments as a voltage controlled voltage supply. The capacitor CL 120 shown in FIG. 2a as coupled to the output node represents a capacitive load, as in FIG. 1, driven by the signal driver circuit 200.

Setting the VHigh voltage lower than the Vcc can reduce dynamic power consumption of signal driver circuitry. As previously discussed, the dynamic power consumption of a conventional CMOS inverter signal driver, such as that shown in FIG. 1b, can be calculated using the equation:

$$P = C \times Vcc^2 \times f,$$

where C is the equivalent capacitance for the circuit, Vcc is the supply voltage, and f is the switching frequency of the input signal. In contrast, the power for the signal driver circuit 200 can be calculated using the following equation:

$$P = C \times Vcc \times Vsw \times f,$$

where C is the equivalent capacitance for the circuit, Vcc is the supply voltage, Vsw is the swing voltage, and f is the switching frequency of the input signal. Setting the VHigh voltage to less than Vcc reduces the Vsw voltage of the signal driver circuit 200 compared to the Vsw of the signal driver circuit 100. That is, in embodiments of the present invention where Vsw is less than Vcc (i.e., the swing voltage for the signal driver circuit 100), the power consumption of is less than the power consumption of signal driver circuits, such as signal driver circuit 100. Put another way, $$(C \times Vcc \times Vsw \, f) < (C \times Vcc^2 \times f), \text{ because Vsw} < \text{Vcc}.$$

In operation, the signal driver circuit 200 generates an output signal at the output node 208 in accordance with the logic level of the in (and inB) signal. When generating a high logic level output signal in response to a low-logic level in signal, the signal driver circuit 200 provides a high logic level having a VHigh voltage.

Figure 3A:
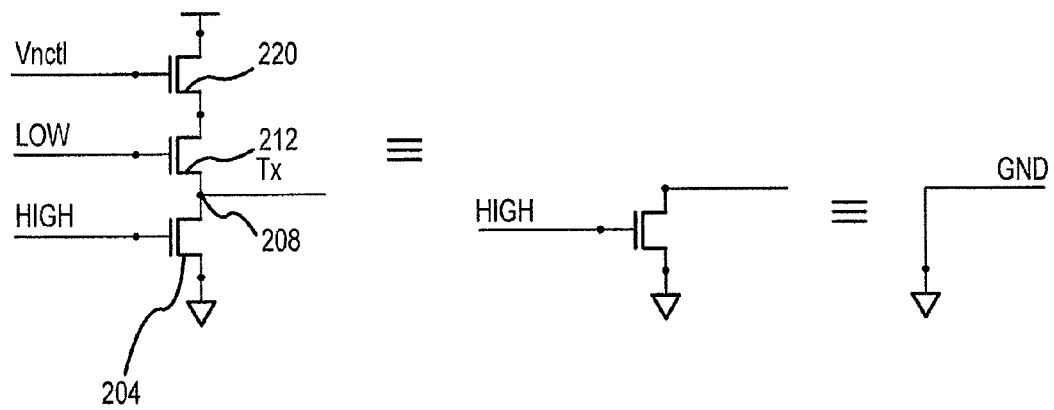
FIG. 3a is a diagram of an equivalent circuit of the signal driver circuit of FIG. 2a for an input having a high logic level.

FIG. 3a illustrates an equivalent circuit for the signal driver circuit 200 in response to receiving an in signal having a high logic level (inB is low). As shown, the transistor 204 is conductive due to the high in signal and the transistor 212 is not conductive due to the low inB signal. As a result, the equivalent circuit is the output node 208 coupled to the reference node, shown in FIG. 2a as ground. Thus, for a high in signal, the signal driver circuit 200 generates a low output signal at the output node 208.

Figure 3B:
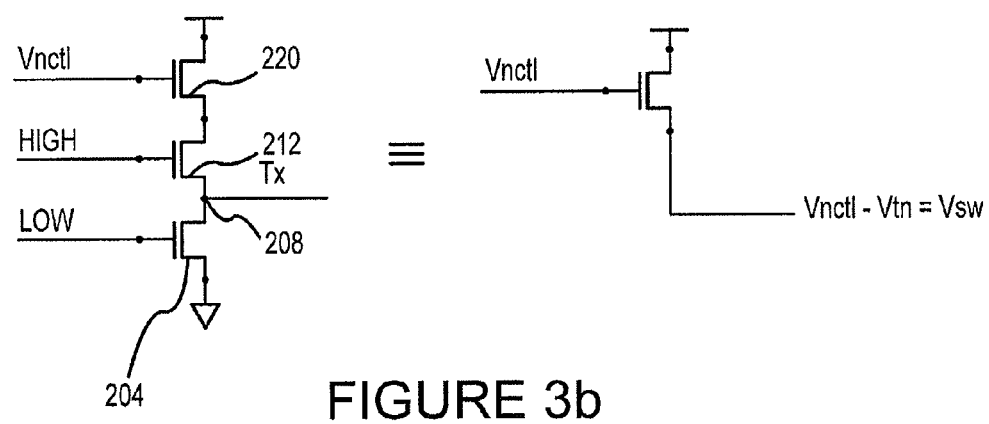
FIG. 3b is a diagram of an equivalent circuit of the signal driver circuit of FIG. 2a for an input signal having a low logic level.

FIG. 3b illustrates an equivalent circuit for the signal driver circuit 200 in response to receiving an in signal having a low logic level (inB is high). The transistor 204 is not conductive due to the low in signal and the transistor 212 is conductive due to the high inB signal. As a result, the equivalent circuit for the signal driver circuit 200 for this condition is the output node 208 coupled to the source of the transistor 220. As previously discussed, the transistor 220 is used to set the VHigh voltage (the voltage of a high logic level of the output signal) according to the Vnctl voltage. The VHigh voltage, provided at the source of the transistor 220, is coupled to the output node 208 in the equivalent circuit. The voltage of the resulting output signal is VHigh, which in the case where Vss is ground, the voltage of the output signal is Vsw, as shown in FIG. 3b.

As further shown in FIG. 3b, the voltage of the output signal for a low in signal will generally not exceed VHigh because the transistor 220 is no longer conductive when the voltage of the output node is greater than VHigh. That is, when the voltage of the output node 208 is greater than VHigh, the difference between voltages of the gate of the transistor 220 (at Vnctl, where Vnctl=VHigh+Vtn, as previously discussed) and its source (at VHigh) is less than Vtn for the transistor 220, which causes the transistor 220 to not be conductive. In turn, the output node 208 is decoupled from any voltage. When the voltage of the output node 208 becomes less than VHigh, the transistor 220 becomes conductive because the difference between the gate and source voltage exceeds Vtn. As a result the output node 208 is coupled to a voltage.

For example, where Vtn is 0.4 V, the desired VHigh is 0.4 V, and Vcc>VHigh, the Vnctl voltage should be 0.8 V. Given these conditions, if the output node 208 exceeds 0.4 V, the gate-source voltage for the transistor 220 becomes less than 0.4 V, and the transistor 220 becomes non-conductive because the gate-source voltage is less than Vtn. As a result, the output node 208 is decoupled from any voltage. When the voltage of the output node 208 is at 0.4 V or less, the gate-source voltage of the transistor 202 exceeds Vtn, and consequently, the transistor 202 is conductive and provides 0.4 V (i.e., Vnctl−Vtn) at its source node. The particular values have been provided by way of example, and are not intended to limit the scope of the present invention.

Setting the VHigh voltage of a high logic level less than the full supply voltage, such as Vcc, provides advantages in terms of lower power consumption compared to a conventional signal driver circuit providing a high logic level of Vcc, as previously discussed. Another advantage to having VHigh less than Vcc is generally faster transition times between high and low logic levels because the swing voltage Vsw between the high and low logic levels is less than for transitions to and from Vcc. That is, the lower VHigh level will generally take less time to be reached when transitioning from a low logic level (e.g., ground).

Figure 4:
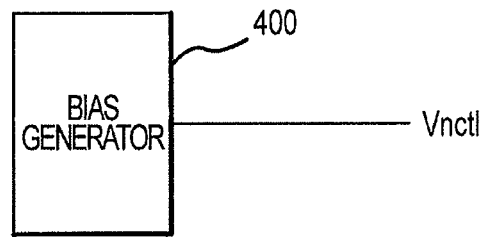
FIG. 4 is a block diagram of a bias voltage circuit according to an embodiment of the present invention.

FIG. 4 illustrates a bias voltage generator 400 according to an embodiment of the present invention. The bias voltage generator 400 can be used to provide a Vnctl voltage to one or more signal driver circuits, such as the signal driver circuit 200. The bias voltage generator 400 provides a Vnctl voltage to the transistor 220 (FIG. 2) having a voltage equal to (VHigh+Vtn). Under this condition, the signal driver circuit 200 can drive an high-logic level output signal having a voltage of VHigh.

Figure 5A:
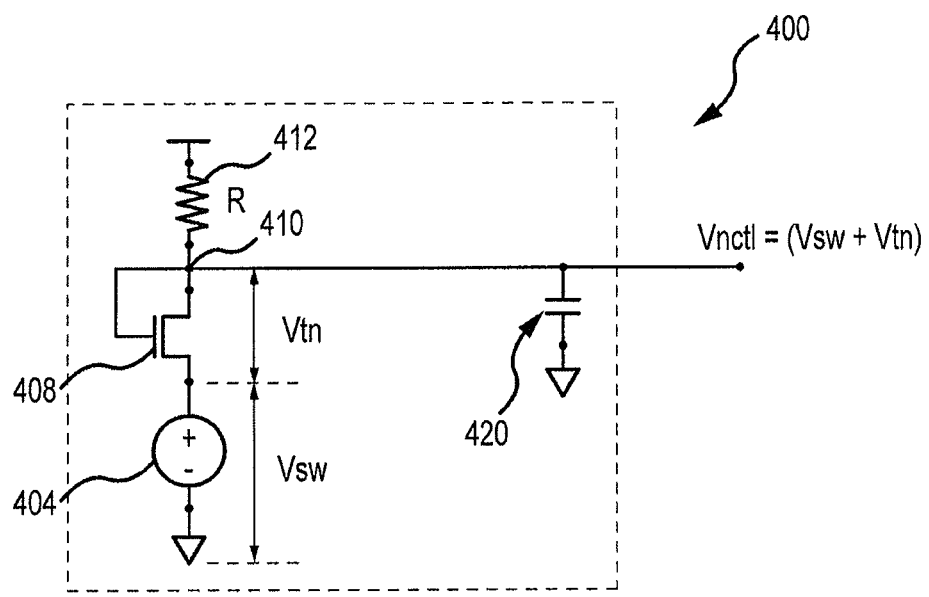
FIG. 5a is a schematic drawing of a bias voltage circuit according to another embodiment of the invention.

FIG. 5a illustrates an embodiment of a bias voltage generator 400. The bias voltage generator 400 includes a voltage supply 404 and a transistor 408 coupled between a bias voltage output 410 and a reference voltage, such as ground. The voltage supply 404 provides a constant voltage equal to the VHigh voltage. Conventional voltage supplies can be used for the voltage supply 404. As shown in FIG. 4, where the VLow voltage is equal to zero (i.e., ground), the voltage supply 404 provides a constant voltage equal to the Vsw voltage, which is equal to the VHigh voltage under this condition. The transistor 408 is coupled as a diode between the bias voltage output 410 and the voltage supply 404 to provide a voltage approximately equal to Vtn of the transistor of the signal driver circuit to which the Vnctl voltage is applied. For example, with reference to the signal driver circuit 200 (FIG. 2), the transistor 408 is diode-coupled to provide a voltage equal to the Vtn of the transistor 220. In some embodiments, the transistor 408 has similar transistor characteristics as the transistor to which the Vnctl voltage is applied. As a result, process variations during fabrication of the circuits and variations in operating conditions will be accommodated because the transistor characteristics for both the transistor 408 and the transistor to which the Vnctl voltage is applied will be influenced in the same manner. A resistive load 412 is coupled between a voltage supply, such as Vcc, and the bias voltage output 410. The resistive load 412 provides a weak pull-up current path for the bias voltage output 410. An optional capacitor 420 can be coupled to the bias voltage output 410 for filtering noise in the Vcc supply voltage or ground.

In operation, the bias voltage output 410 is set at the Vnctl voltage by the VHigh/Vsw voltage supply 404 and the diode coupled transistor 408. As previously discussed, the resulting Vnctl voltage is equal to (VHigh+Vtn). The resistor 412, which generally has a large resistive value, provides a sufficient voltage drop in Vcc so that the Vnctl voltage can be output. As previously discussed, the Vnctl voltage is used to set the VHigh voltage of the signal driver circuit.

Figure 5B:
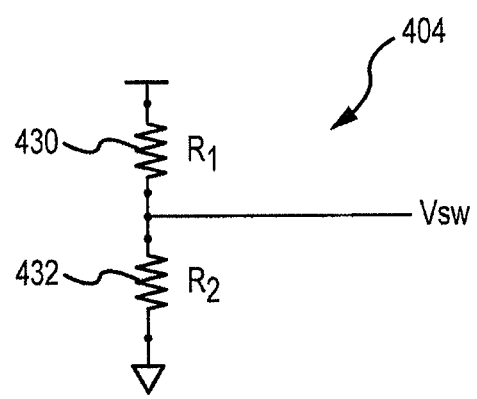

In an alternative embodiment of the bias voltage generator, the bias voltage output 410 of the bias voltage generator of FIG. 5b can be coupled to a buffering circuit (not shown), for example, an operational amplifier coupled as a unity gain buffer, to provide a stable Vnctl voltage having greater drive capability.

In an embodiment of the invention, the voltage supply 404 is implemented using a voltage divider circuit. FIG. 5b illustrates an example of providing a Vsw voltage using a voltage divider circuit having resistance 430 and resistance 432 coupled in series between Vcc and ground. As known in the art, the ratios of the magnitude of the resistances 430 and 432 can be selected to provide a desired voltage, such as Vsw. Although the voltage supply 404 illustrated in FIG. 5b is shown having only two resistances, other embodiments can include a greater number of resistances. For example, where Vcc is equal to 1.2 V and the desired Vsw is equal to 0.4 V, three resistors having the same resistance can be coupled in series between Vcc and ground to provide the Vsw voltage. That is, a Vsw voltage of 0.4 V would be provided at the terminal of the resistor coupled to ground. In other embodiments of the invention, the voltage supply 404 is implemented by using a conventional bandgap voltage source to provide the constant VHigh voltage. As known, a bandgap voltage source can provide a constant VHigh voltage even if the supply voltage fluctuates, for example, due to noise.

Other techniques for generating the bias voltage Vnctl can be used in other embodiments, and consequently, the invention is not limited to a particular technique for generating the Vnctl voltage.

Figure 6:
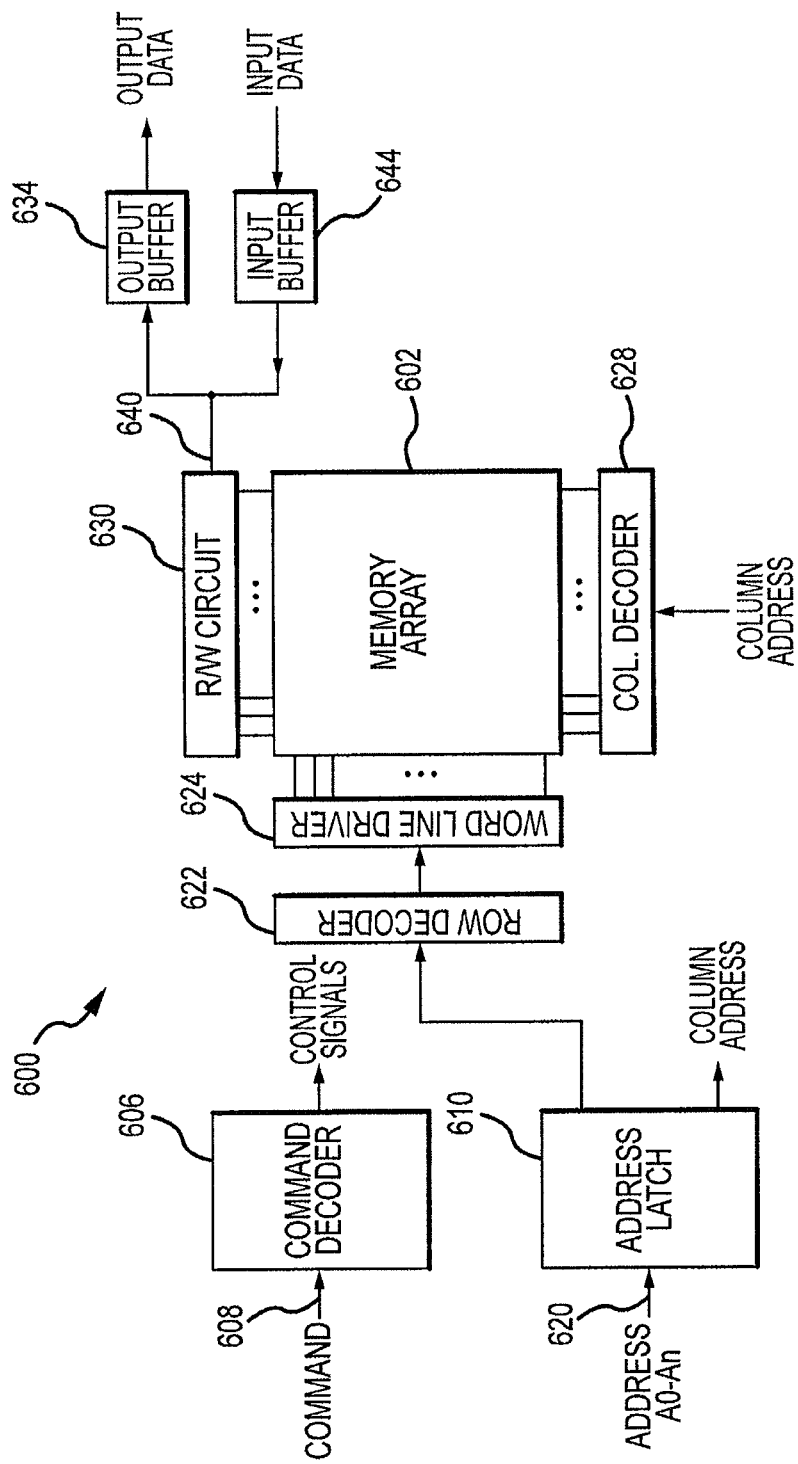
FIG. 6 is a block diagram of a memory system according to an embodiment of the invention using the signal driver circuit of FIG. 2a or an signal driver circuit according to some other embodiment of the invention.

FIG. 6 illustrates a portion of a memory system 600 according to an embodiment of the present invention. The memory system 600 includes an array 602 of memory cells, which may be, for example, DRAM memory cells, SRAM memory cells, flash memory cells, or some other types of memory cells. The memory system 600 includes a command decoder 606 that receives memory commands through a command bus 608 and generates corresponding control signals within the memory system 600 to carry out various memory operations. Row and column address signals are applied to the memory system 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. Write data are applied to the memory array 602 through a data input buffer 644 and the memory array read/write circuitry 630. The command decoder 606 responds to memory commands applied to the command bus 608 to perform various operations on the memory array 602. In particular, the command decoder 606 is used to generate internal control signals to read data from and write data to the memory array 602.

Signal driver circuits according to embodiments of the present invention are included in the memory system 600. In some embodiments of the memory system 600, signal driver circuits are configured to drive internal or on-chip signals from one internal component to another, for example, driving the internal control signals from the command decoder 606 to other internal components of the memory system 600. Other examples include driving internal address signals from the address decoders 622, 628, and driving internal data signals over the input-output bus 640. In other embodiments of the memory system 600, signal driver circuits are configured to drive data signals external to the memory system 600. For example, the output buffer 634 can include signal driver circuits configured to drive output data signals to circuits external the memory system 600. Signal driver circuits may be utilized in other applications as well for other embodiments of the invention.

Figure 7:
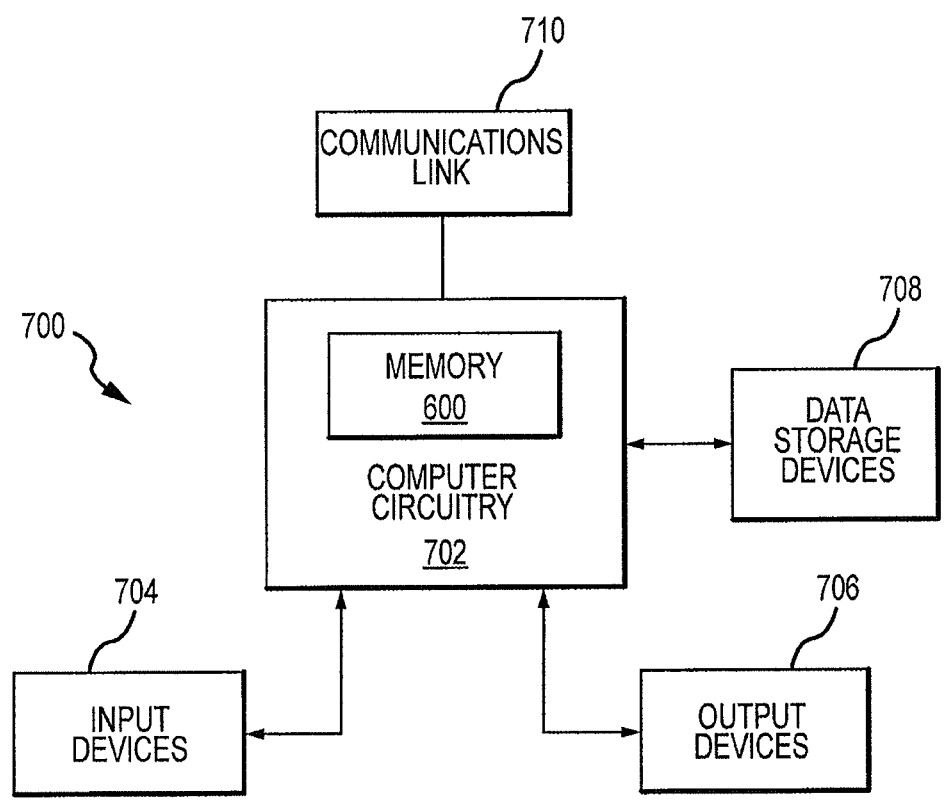
FIG. 7 is a block diagram of a processor-based system using the memory system of FIG. 6 or a memory system according to some other embodiment of the invention.

FIG. 7 is a block diagram of a processor-based system 700, including computer circuitry 702 that contains the memory system 600 of FIG. 6 or a memory system according to some other embodiment of the invention. The computer circuitry 702 performs various computing functions, such as executing specific software to perform specific calculations or tasks. In addition, the processor-based system 700 includes one or more input devices 704, such as a keyboard, coupled to the computer circuitry 702 to allow an operator to interface with the processor-based system. Typically, the processor-based system 700 also includes one or more output devices 706 coupled to the computer circuitry 702, such output devices typically being a display device. One or more data storage devices 708 are also typically coupled to the computer circuitry 702 to store data or retrieve data. Examples of storage devices 708 include hard disks and non-volatile memory. The processor-based system 700 also includes a wireless communication link 710 through which the computer circuitry can send and receive data through a wireless medium. The computer circuitry 702 is typically coupled to the memory system 600 through appropriate address, data, and control busses to provide for writing data to and reading data from the memory system 600.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory system, comprising:
   a plurality of memory cells;
   a data path coupled to the array of memory cells, the data path operable to couple read data from the plurality of memory cells and to couple write data to the plurality of memory cells;
   a signal driver circuit coupled to the data path to drive an output signal on the data path having a logic level according to an input signal, the signal driver circuit comprising:
      a driver circuit configured to provide a first logic level signal having a first voltage or a second logic level signal having a second voltage according to the input signal; and
      a voltage controlled voltage supply coupled to the driver circuit and configured to provide the first voltage for the first logic level signal, the voltage controlled voltage supply configured to provide the first voltage having a magnitude according to a bias voltage, wherein the bias voltage comprises a voltage equal to the sum of a voltage representing a threshold voltage of a voltage controlled impedance circuit and the first voltage; and
      a bias voltage, generator coupled to the voltage controlled voltage supply and configured to provide the bias voltage to the voltage controlled voltage supply.

2. The memory system of claim 1 wherein the signal driver circuit is configured to receive signals and drive signals internal to the memory system.

3. The memory system of claim 1 wherein the signal driver circuit is configured to drive signals external to the memory system.

4. The memory system of claim 1 wherein the voltage controlled voltage supply of the signal driver circuit comprises a metal-oxide semiconductor transistor having a gate to which the bias voltage generator is coupled.

5. The memory system of claim 4 wherein the bias voltage generator comprises:
   an output node coupled to the voltage controlled voltage supply to provide the bias voltage;
   a voltage supply configured to generate a voltage equal to the first voltage;
   a diode coupled to the output node and the voltage supply, the diode configured to provide a voltage across the diode equal to a threshold voltage of the metal-oxide semiconductor transistor; and
   a pull-up source coupled to the output node and configured to maintain the bias voltage at the output node.

6. The memory system of claim 1 wherein the second voltage is ground.

7. The memory system of claim 1 wherein the signal driver of the signal driver circuit comprises:
   a first transistor coupled to a reference node and the signal driver node; and
   a second transistor coupled to the signal driver node and the voltage controlled voltage supply.

8. The memory system of claim 1 wherein the voltage controlled voltage supply of the signal driver circuit is further coupled to a supply voltage and comprises a voltage controlled voltage supply configured to provide the first voltage for the first logic level, the first voltage less than the supply voltage.

9. The memory system of claim 1 wherein the bias voltage generator comprises a voltage divider circuit and a diode coupled transistor.

10. A memory system, comprising:
    a memory array;
    a decoder coupled to the memory array and configured to decode received command signals and to generate control signals responsive, at least in part, to receipt of command signals;
    a signal driver circuit coupled to the decoder and configured to drive the control signals, wherein the signal driver circuit comprises:
       a driver circuit configured to provide at least one of a first voltage and a second voltage according to an input signal, the first voltage having a magnitude according to a bias voltage; and
       a voltage controlled impedance circuit coupled to the driver circuit and having a threshold voltage, wherein the bias voltage comprises a voltage equal to the sum of the threshold voltage and the first voltage; and
    a bias voltage generator coupled to the voltage controlled impedance circuit and configured to provide the bias voltage.

11. The memory system of claim 10, wherein the first voltage corresponds to a first logic level and the second voltage corresponds to a second logic level.

12. The memory system of claim 11, wherein the bias voltage generator comprises a voltage divider.

13. The memory system of claim 10, wherein the driver comprises a complementary metal oxide semiconductor inverter.

14. The memory system of claim 10, wherein the voltage controlled impedance circuit of the signal driver circuit comprises a transistor having a gate to which the bias voltage generator is coupled.

15. A method of driving an output signal, comprising:
    receiving a read data signal from memory cells;
    driving an output node to a reference voltage responsive, at least in part, to the read signal having a first logic level; and
    driving an output node to a high logic voltage responsive, at least in part, to the read data signal having a second logic level, the high logic voltage based, at least in part, on a bias voltage,
    wherein the bias voltage is equal to the sum of the high logic voltage and a threshold voltage of a voltage controlled impedance circuit coupled between a power supply and the output node.

16. The method of claim 15, wherein the magnitude of the high logic voltage is substantially constant.

17. The method of claim 15, wherein the reference voltage is ground.

18. The method of claim 15, wherein the output node is coupled to an output buffer.

19. The method of claim 15, wherein the bias voltage is provided by a bias voltage generator comprising a voltage divider circuit and a diode coupled transistor.

20. The method of claim 19, wherein the bias voltage is stabilized by a buffering circuit.

* * * * *

UNITED STATES PATENT AND TRADEMARK OFFICE
CERTIFICATE OF CORRECTION

PATENT NO.        : 8,581,630 B2                                         Page 1 of 1
APPLICATION NO.   : 13/235243
DATED             : November 12, 2013
INVENTOR(S)       : Seong-Hoon Lee It is certified that error appears in the above-identified patent and that said Letters Patent is hereby corrected as shown below:

In the Claims:

In column 7, line 35, delete "voltage," and insert -- voltage --, therefor.

Signed and Sealed this
Eighteenth Day of February, 2014

Michelle K. Lee
*Deputy Director of the United States Patent and Trademark Office*